(12) United States Patent
Fifield et al.

(10) Patent No.: US 10,983,172 B2
(45) Date of Patent: Apr. 20, 2021

(54) SYSTEMS AND METHODS FOR SOFTWARE-CONFIGURABLE BATTERY MONITORING SYSTEM

(71) Applicant: Maxim Integrated Products, Inc., San Jose, CA (US)

(72) Inventors: Antoine D. Fifield, Mesa, AZ (US); Daniel James Miller, Gilbert, AZ (US); Brian A. Miller, Gilbert, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 159 days.

(21) Appl. No.: 16/401,293

(22) Filed: May 2, 2019

(65) Prior Publication Data

US 2019/0353713 A1    Nov. 21, 2019

Related U.S. Application Data

(60) Provisional application No. 62/673,572, filed on May 18, 2018.

(51) Int. Cl.
*G01N 27/416* (2006.01)
*G01R 31/396* (2019.01)
(Continued)

(52) U.S. Cl.
CPC ..... *G01R 31/396* (2019.01); *G01R 19/16542* (2013.01); *G01R 31/3644* (2013.01); *G01R 31/382* (2019.01); *G01R 31/3835* (2019.01); *G01R 31/3842* (2019.01); *G01R 31/392* (2019.01); *H02J 7/0014* (2013.01); *H02J 7/0021* (2013.01); *B60L 58/12* (2019.02); *B60L 58/22* (2019.02); *Y02E 60/10* (2013.01); *Y02E 60/50* (2013.01)

(58) Field of Classification Search
CPC  G01R 31/396; G01R 31/3835; G01R 31/382; G01R 31/3842; G01R 31/392; G01R 19/16542; G01R 31/3644; G01R 31/367; Y02E 60/10; Y02E 60/50; H02J 7/0021; H02J 7/0014; B60L 58/12; B60L 58/22; B60L 58/10; Y02T 10/70
USPC ................. 324/76.11–76.83, 425, 426, 434
See application file for complete search history.

(56) References Cited

U.S. PATENT DOCUMENTS

| 9,425,631 B2 | 8/2016 | Furtner |
| 2007/0114968 A1* | 5/2007 | Krah ........................ H02J 1/10 320/103 |

(Continued)

*Primary Examiner* — Raul J Rios Russo
(74) *Attorney, Agent, or Firm* — North Weber & Baugh LLP; Michael North (57) ABSTRACT

Described herein are systems and methods that allow for automatic detection of the highest available cell voltage and/or location of the top voltage in a battery stack, in real-time, without having to use separate, dedicated PCBs for different battery stack configurations, and without having to manually configure PCBs based on the number of cells each battery stack has. In certain embodiments, automatic detection is accomplished by a software-configurable battery management circuit that supports any battery pack size without the need to perform hardware modifications or the added cost of customizing boards for battery stacks that have different numbers of cells. In addition, a novel diode-OR analog multiplexer circuit allows the chip to be powered prior to the selection of the top cell.

20 Claims, 6 Drawing Sheets

(51) Int. Cl.
*H02J 7/00* (2006.01)
*G01R 31/36* (2020.01)
*G01R 31/3835* (2019.01)
*G01R 31/382* (2019.01)
*G01R 31/3842* (2019.01)
*G01R 31/392* (2019.01)
*G01R 19/165* (2006.01)
*B60L 58/12* (2019.01)
*B60L 58/22* (2019.01)

(56) References Cited

U.S. PATENT DOCUMENTS

| | | | |
|---|---|---|---|
| 2009/0309552 A1* | 12/2009 | Krah | H02J 1/10 320/140 |
| 2018/0076638 A1 | 3/2018 | Shibata | |
| 2019/0302186 A1* | 10/2019 | Fifield | G01R 31/3835 |

* cited by examiner

SYSTEMS AND METHODS FOR SOFTWARE-CONFIGURABLE BATTERY MONITORING SYSTEM

CROSS-REFERENCE TO RELATED APPLICATIONS

This patent application is related to and claims priority benefit under 35 U.S.C. § 119(e) to commonly-owned U.S. Provisional Patent Application No. 62/673,572, entitled "SYSTEMS AND METHODS FOR SOFTWARE-CONFIGURABLE BATTERY MANAGEMENT SYSTEM," naming as inventors Antoine D. Fifield, Daniel James Miller, and Brian A. Miller, and filed May 18, 2018, which patent document is incorporated by reference herein in its entirety and for all purposes.

A. TECHNICAL FIELD

The present disclosure relates generally to systems and methods for managing energy storage devices. More particularly, the present disclosure related to systems and methods for accurately monitoring, controlling, and protecting rechargeable high-voltage batteries.

B. BACKGROUND

Bidirectional battery-powered applications, such as those used for electrical vehicles, typically employ rechargeable batteries as storage devices that generate electrical energy from chemical energy to deliver power to a load at a relatively high supply voltage and sometimes hundreds of Amperes of current. Such rechargeable high-performance batteries oftentimes comprise an arrangement of individual cells that are grouped into packs or blocks of cells that are stacked to form a single battery, such that the cell at the top of the battery stack has the highest voltage, and cell at the bottom of the battery stack has the lowest voltage, e.g., with respect to a vehicle's chassis. A number of cells may be grouped into a pack of cells that can be individually monitored by respective monitoring devices that also perform safety functions.

Given the increasing energy density of modern high-performance batteries and the even faster growing demand for rapid charging, events that exceed safe charging and discharging current, voltage, temperature, and other parameters are likely to cause damage to the entire circuit, e.g., permanent physical damage due to overheated cells caused by charging Li-Ion cells using voltages exceeding manufacturer-recommended limits.

For safety, user-friendliness, and regulatory compliance reasons, charging and discharging voltages are typically monitored, e.g., as part of a redundant safety check to ensure operation within acceptable ranges so as to prevent system failure, accidental damage, or simply a degradation in performance and battery-life.

Another reason to monitor battery voltage is that different cells in a battery do not have the exact same cell chemistry. This causes variations in internal resistance that result in unequal charging times and varying output (i.e., open circuit) voltages for otherwise identical cells. Under ideal operating conditions, each cell in a block of cells is fully chargeable to the exact same capacity and generates the same, highest allowable open circuit voltage, such that the collection of cells in a battery stack maintains the highest possible total battery voltage. This would eliminate the need for energy transfer and charge redistribution and ensure optimal utilization of a battery's capacity.

However, due to manufacturing variances, it is virtually impossible to manufacture cells with identical electrical properties to store and provide the same maximum amount of charge a battery can hold. For example, to reach identical open circuit voltages, a cell having a high internal impedance will require a higher charging current than a cell having lower internal impedance. Similarly, the weakest (i.e., most degraded) cell in a string of series-connected cells will have the lowest capacity (and open circuit voltage) and, thus, dominate the charging time of the entire string, leading to sub-optimal battery performance.

Inefficiencies caused by charge imbalance, e.g., when a cell having an intermediate voltage in the stack is selected to draw power from rather than the cell having the highest voltage, are exacerbated over time by changing load conditions (e.g., overcharging at short-duration regenerative braking), aging (breakdown of electrochemical material causing loss of capacity), hysteresis in a charge cycle, and other events that ultimately diminish battery life. Therefore, it would be desirable to monitor and configure, in real-time and with minimal complexity, the condition of all cells that make up a battery, such that charge can be redistributed among cells as necessary in order to prevent undesirable overcharge and undercharge conditions.

In many applications, battery voltage is monitored by a voltage measuring system that is located on a PCB that has a dedicated voltage pin for accessing the highest voltage in a battery stack. This pin is external to the battery itself and connected to the top of the battery stack. Since, depending on the application, the number of cells in a stack may vary from battery to battery, traditional battery monitoring systems utilize either different PCBs for different battery stack configurations or a single PBC that is then manually configured according to the number of cells in any given stack. In other words, each board has a dedicated voltage power pin that has to be manually configured according to the number of cells that determines the location of the top voltage in the stack.

In addition, to reduce overall wiring and the complexity/ inefficiencies associated therewith, many existing systems use a number of distributed monitoring circuits, e.g., boards that have a fixed number of pins that accommodate a fixed number of channels that supervise a fixed number of cells, e.g., 14 cells. In practice, the number of cells that share a control board is determined by the voltage rating of that board. Thus, a battery system comprising stacks of, e.g., eight cells will have to use a board that is customized for eight cells, a harnesses that is customized for eight cells, etc., designed to monitor and control exactly the number of channels as the to-be measured cells.

Alternatively, the user may pay a premium for a single high-capacity board design that can withstand the voltage of more than eight cells, e.g., 14 cells. In addition, the board will have to undergo any hardware and software modifications that are necessitated by the mismatch between the number of cells that the board is designed for and the number of cells the board is ultimately operated with. Such modifications include hardwiring switch pins into the board, or using jumpers that physically short channels in order to adjust number of cells to be controlled. Additional requirements of this alternative approach include scanning all channels of the board and then ignoring or masking data from unwanted channels as erroneous data. In addition to the added complexity, jumpers are prone to failure and, thus, not suitable for applications that operate under heightened safety standards, such as aerospace and electric vehicle applications.

Accordingly, to overcome the shortcoming of existing approaches, what is needed are monitoring systems and methods that to automatically configure control boards to accurately monitor battery health and support any pack size without the need for hardware modifications or the added cost of customizing boards for battery stacks that have different numbers of cells.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that: (1) certain steps may optionally be performed; (2) steps may not be limited to the specific order set forth herein; (3) certain steps may be performed in different orders; and (4) certain steps may be done concurrently.

In this document "cell" and "battery cell" are used interchangeably. Similarly, the terms "pack" "stack," and "block," as in "stack of cells," "battery pack," "pack of cells," or "block of battery cells" may be used interchangeably. It is understood that the battery management systems and methods of the present disclosure may be applied to a wide variety of energy sources, such as high-capacity capacitors, Lithium-Ion cells, fuel cells, and other electrochemical and non-chemical cells and combinations thereof.

Figure 1:
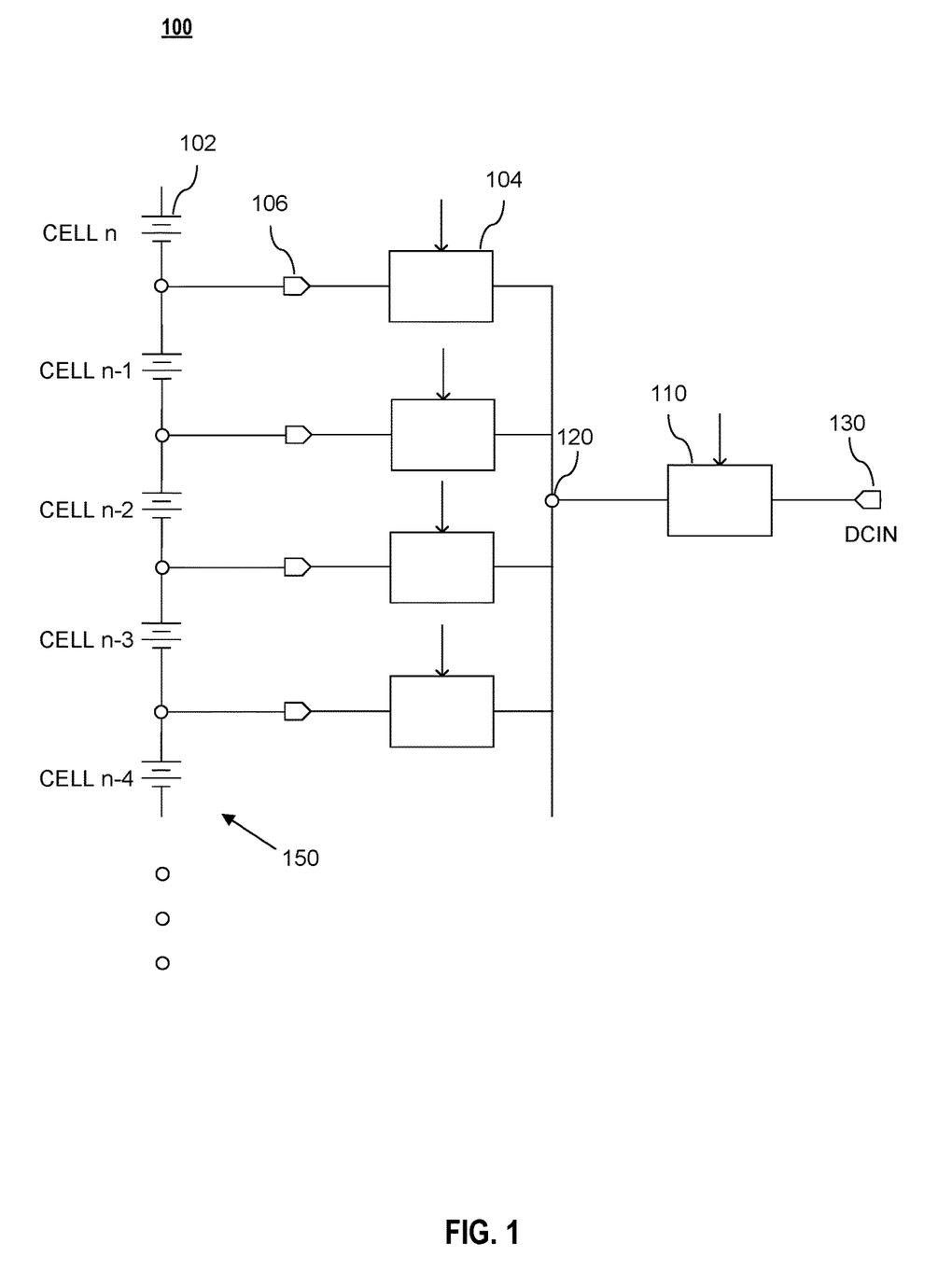
FIG. 1 is a schematic of an illustrative software-configurable system for selecting the highest cell voltage in a battery pack, according to various embodiments of the present disclosure.

FIG. 1 is a schematic of an illustrative software-configurable system for selecting the highest cell voltage in a battery pack, according to various embodiments of the present disclosure. System 100 comprises cells 102, battery pack 150, switches 104, power pins 106, common node 120, common switch 110, and input node 130. Cell 102 is any type of energy source that generates an output voltage. For electrochemical cells, the cell voltage (i.e., the open circuit voltage) is generally a function of the capacity of the cell to hold electrical charge. Cells 102 depicted in FIG. 1 are battery cells that are electrically connected in a series configuration. However, this is not a limitation on the scope of the present disclosure. One skilled in the art will appreciate that cells 102 may be any combination of series and parallel configurations that generates a battery voltage.

In embodiments, individual cells 102, are arranged to form battery pack 150 that may supply a battery with a voltage that equals the sum of each of the voltages of series-connected cells 102. Each cell 102 may be coupled to a dedicated switch 104 (that may be implemented as reversed switches) that allows individual cells or groups of cells to be tapped and electrically coupled to common node 120, which, in embodiments, enables system 100 to operate as a multiplexed circuit, as will be discussed in greater detail below.

In embodiments, system 100 provides power for a battery monitoring circuit that accurately measures and monitors the condition of any number of cells 102 (e.g., Lithium-Ion cells) in battery stack 150, for example, to determine the health of a battery that may comprise any number of battery stacks. In embodiments, as will be discussed in greater detail with respect to FIG. 3, monitoring involves coupling to a power pin 106 two or more filtered switches 104 that create alternative electrical paths, one for performing precision diagnostic measurements and the other for transferring power between cells 102 and input node 130 at regular operation. In embodiments, in addition to performing precision measurements using a noise-filtered path, system 100 may be configured to perform cell-balancing, e.g., by dissipating energy from a cell or redistributing charge between cells. Overall, by accessing the highest cell voltage in a stack to draw power from rather than selecting a cell that has an intermediate voltage, system 100 does not create a misbalance that causes and undesirable inefficiencies associated therewith.

In operation, each cell 102 supplies a voltage (e.g., 4.2 V) that can be detected at shared common node 120, e.g., by sequentially measuring a voltage differential between adjacent cells 102. In embodiments, individually measured cell voltages may be added to obtain a sum of cell voltages. For example, voltage in battery stack 150 may be measured in a progression from cell 1 to cell n, according to increasing voltage of cells connected in series, and from cell n decreasing in voltage down to cell 1, so as to account for hysteresis effects (e.g., by averaging corresponding measurement values) and/or to compensate for any amplifier offset during measurements.

In embodiments, to determine the highest voltage in system 100, a number of switches 104 is controlled to operate in a manner such that when switches 104 are open, the combination of their body-diodes creates a diode-OR circuit within system 100 that delivers the highest of the voltages of the cells 102 to common node 120. Depending on the status of common switch 110, that highest voltage at common node 120 may be provided to input pin 130. This diode-OR switch topology, in effect, serves as an analog multiplexer that couples input pin 130 to the highest of the voltages of the cells 102, for example, to drive a load that is coupled to and can draw power from input pin 130.

In addition, the diode-OR analog multiplexer action enables system 100 to identify the cell that defines the highest voltage within battery pack 150. This provides a user with the flexibility to use a self-selecting multiplexer to automatically select the location where the highest voltage in battery pack 150 should be sensed. This may then, in normal operation or as part of an initialization procedure, be used, e.g., as a redundant safety check to verify the proper operation of cells 102 or to detect a fault condition as described in patent application No. 62/652,225, entitled "Systems and Methods for Software-Configurable Battery Management System," listing Antoine Fifield, Jiuhui Wang, and Daniel Miller as inventors and filed on Apr. 3, 2018, which application is herein incorporated by reference in its entirety.

For example, in embodiments, proper operation of cells 102 may be verified by using an ADC or similar circuit (not shown) to compare the highest determined voltage at the top of battery pack 150 to the sum of the voltages of cells 102, e.g., as diagnostic measurement to satisfy safety requirements, or to determine whether the difference between the two values exceeds a user-defined threshold and take appropriate action.

In embodiments, at an initial power sequence, e.g., at start-up, when it is not yet known how many and which cells 102 are connected to system 100, the diode-OR analog multiplexer can serve to automatically select the highest voltage (or to be more exact, one diode voltage below the highest voltage) among a number of cells 102 present, e.g., by turning off all switches 104, such that input node 130 is coupled to the cell having the highest voltage in system 100, such that the highest voltage less the diode voltage of that switch 104, may appear at input node 130. This resulting voltage at input node 130 may then be used to draw power from the highest voltage cell 102.

In embodiments, once the cell with the highest voltage is identified, other switches may be configured, e.g., via commands obtained from a microcontroller, and the total number of active cells may be ascertained. For example, in embodiments, one or more sequences defined in patent application No. 62/652,225 may be implemented in an algorithm to select an appropriate switch using software.

Therefore, even if system 100 operates as a battery monitoring system that uses no EEPROMs or other non-volatile memory, such that it lacks awareness of the number of channels present at start-up, and loses its configuration each time it is powered down, system 100 can advantageously automatically detect the highest available voltage at any time.

A person of skill in the art will appreciate that battery monitoring system 100 may be implemented as a single integrated circuit and/or integrated with other systems, for example, as part of a vehicle management system. It is understood that while switch 104, 110 may be implemented using one or more transistors to take advantage of internal body diodes, as discussed in greater detail with respect to FIG. 2, various embodiments may use other switches, such as mechanical relays, in combination with external diodes and other discrete electrical components. It is further understood that, while not shown in FIG. 1, system 100 may comprise additional components, such as logic circuitry to control switch 104, 110, independent power sources, sampling circuitry, and the like, to facilitate interoperability between elements in system 100 and provide additional features, such as measuring or calculating power consumption based on measured cell voltages and other physical and environmental parameters.

Figure 2:
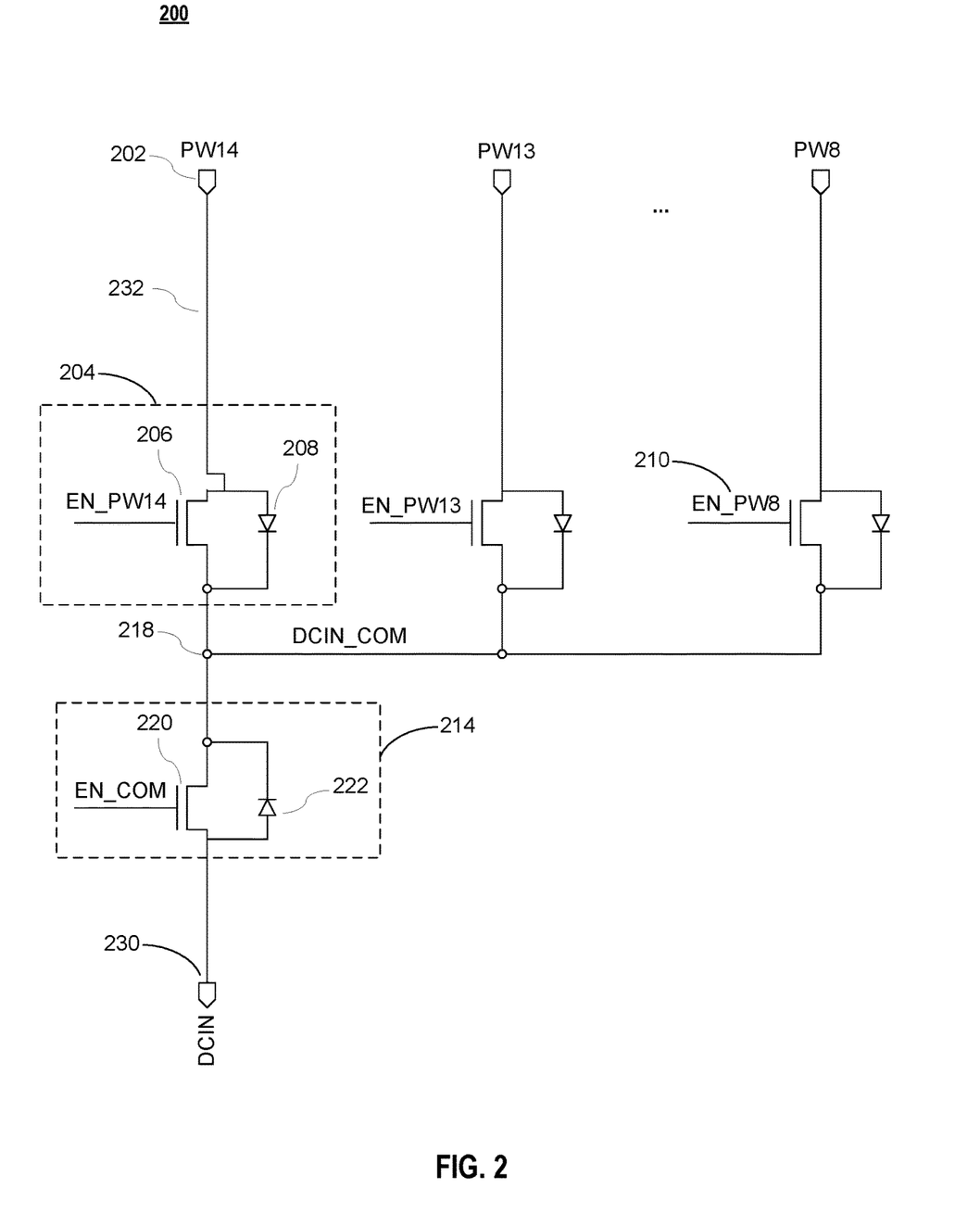
FIG. 2 is a schematic of an illustrative software-configurable circuit, according to various embodiments of the present disclosure.

FIG. 2 is a schematic of an illustrative software-configurable circuit, according to various embodiments of the present disclosure. Monitoring circuit 200 comprises power pins 202 that may be coupled to any number of energy sources, such as battery cells that serve as constant voltage sources, switches 204, common switch 214, and input pin 230 that may be coupled to any load, e.g., an electric engine, that uses the power delivered by the constant voltage sources.

In embodiments, switch 204 and common switch 214 may be implemented as transistors having internal body-diodes 222 and 208 that have been formed as a result of a semiconductor manufacturing process. In embodiments, internal body-diodes 222 and 208 have a common electrical connection, e.g., a common source pin of transistors 206 and 220. In embodiments, switch 204, 214 may be implemented as NMOS transistors that use a small area charge pump to switch on and off controlled by a switch driver (not shown).

It is noted that although designs utilizing a range from 8 to 14 cells per battery pack are shown in FIG. 2, embodiments of present disclosure may be used with any number of cells in a stack and any number of battery stacks 150, each operating at a certain voltage, such that battery stacks 150 may be combined to generate a battery that operates at a total battery voltage approximately equal to the sum of the voltages of the individual battery stacks 150.

Similarly, any number of software-configurable circuits 200 may be coupled to each other, e.g., in a daisy chain configuration, and integrated into a single board that may be coupled to each monitoring circuit 200, e.g., via a dedicated harness.

In operation, when transistors 206, 220 and, thus, switches 204, 214 are deactivated, internal body diodes 208, 222 that are directed in a direction opposite to each other prevent current flow through switch 204 and 214. Since irrespective of whether a positive of negative voltage is applied to power pin 202, one of body diodes 208, 222 will be reverse-biased, such that for the condition that switches 204, 214 are turned off, current is prevented from flowing through electrical path 232. As a result, no cell voltages on pin 202 will appear at input pin 230, in effect, cutting off power to any device that may be connected to pin 230, which is useful when using power pins 202 as dual-use pins 202, e.g., to take accurate voltage measurements.

In embodiments, by opening all switches 204 the highest of the voltages applied to power pins 202 will appear at common node 218, labeled DCIN_COM in FIG. 2, due to the fact that in each of paths 232 that is coupled to a voltage source, body diodes 208, 222 operate to form a diode-OR circuit. The resulting switch topology multiplexes the highest of the voltages (to be accurate, one diode voltage below the highest voltage) on power pin 202 to common node 218.

Monitoring circuit 200 may comprise additional components for scaling, measuring, converting, and outputting voltages and other signals that may be pre-processed or post-processed depending on a particular application. For example, once the highest voltage signal is identified circuit 200 may use the diode-OR switch topology to measure and digitize the highest voltage applied to any pin 202.

Unlike in existing monitoring circuit designs that use dedicated pins that are affixed to a board and designed to be hardwired to operate a fixed number of cells, embodiments presented herein support any number of channels such as to provide the flexibility to determine, e.g., which cell in a block of cells is to be treated as the top of the block without having to externally hardwire cells to power pins 202.

In embodiments, circuit 200 may be automatically configured to operate off the pin that carries the highest voltage. In other words, circuit 200 may configure itself to any pack size (e.g., 8-14 cells) without the need for hardware or software modifications to the board. Based on the determination the highest voltage location, e.g., in normal operation or as part of an initialization procedure, that location may be used to perform a diagnostic procedure, e.g., a redundant, diagnostic safety measurement that verifies that all cells connected to pins 202 operate as expected. In embodiments, unused pins may be left unconnected, i.e., at an undefined floating potential.

In embodiments, once common node switch 214 is opened during measurements, the effect of its parasitic diode 222, which would otherwise prevent a voltage in path 232 from reaching value below a certain value dictated by parasitic diode 222, is eliminated.

The circuit illustrated in FIG. 2 is not limited to the constructional details shown therein or described in the accompanying text. A person of skill in the art will appreciate that a suitable monitoring system may, for example, determine some or all voltages by measuring current instead and then transforming the result into corresponding voltage information.

Figure 3:
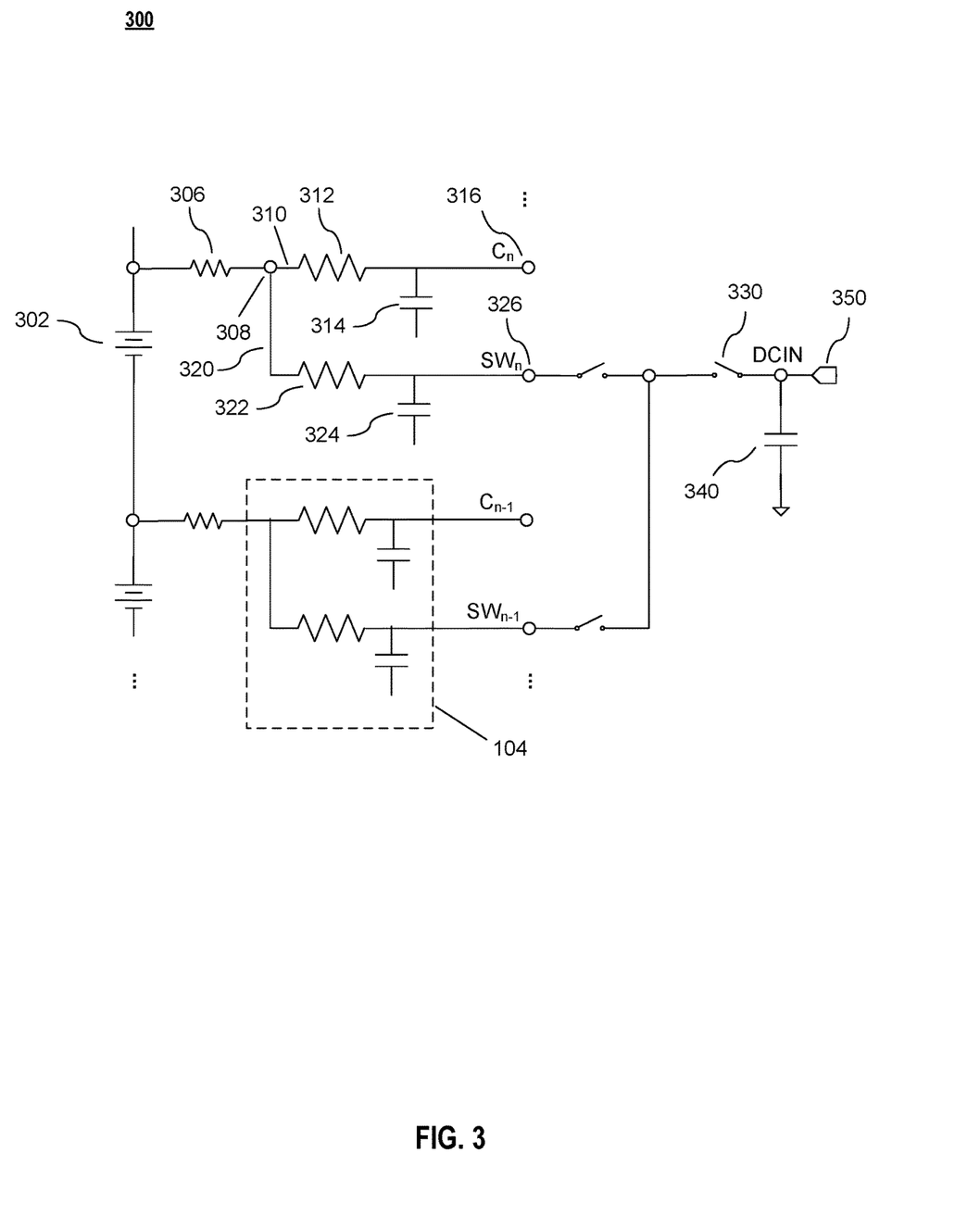
FIG. 3 is a schematic of an illustrative circuit comprising dual-use pins according to various embodiments of the present disclosure.

FIG. 3 is a schematic of an illustrative circuit comprising dual-use sense and power pins, according to various embodiments of the present disclosure. Circuit 300 in FIG. 3 comprises cell 302, first electrical path 310, second path 320, common switch 330, and input pin 350. In embodiments, first path 310 comprises resistor 312, capacitor 314, and pin 316 and second path 320 comprises resistor 322, capacitor 324, pin 326, and DC input 350. Capacitors 314, 324, may be implemented as local filter capacitors of, e.g., a low-path RC filter. As depicted in FIG. 3, capacitors 314, 324 may be coupled from pin to pin. However, a person of skill in the art will appreciate that capacitors 314, 324 may equally be coupled to a reference potential (e.g., ground) at the expense of size.

In embodiments, the two paths 310, 320 may be filtered and coupled to cell 302 of a battery stack, e.g., via wire 306 that may be a harness. First path 310 presents a relatively high electrical resistance (e.g., 1 k'Ω) compared to second path 320 that has a relatively low resistance (e.g., 10 'Ω). As a result, high-impedance path 310 allows for a more accurate, low-noise precision measurement at any cell 302 (e.g., using external filtering) compared to second path 320, which may be more susceptible to noise and more suitable for transferring power between cells 302 and input node 350.

In operation, pin 316 in high-impedance path 310 presents a Kelvin connection that, ultimately, may be connected to a battery. Second path 320 may be used to transfer power to DC input 350, e.g., to drive an external load, such as a device (not shown).

In embodiments, voltage measurements may be performed even when system 300 is actively cell-balancing. In embodiments, second path 320 may be used for redundancy purposes and/or to provide a power path for cell-balancing that may involve, e.g., charge redistribution or discharge across resistors (not shown) that dissipate energy to equalize voltages between cells.

It is understood that, in embodiments, pins 316 and 326 may be the same pin or short-circuited together. It is further understood that measurements in the two paths 310, 320 should be taken close in time to be comparable. In embodiments, both measurements provide redundancy in diagnostics and serve as part of a safety requirement, e.g., to prevent failures such as physical damage caused by overheated cells.

Nodes (e.g., node 308) may be connected to a battery cell (e.g., cell 302) via wire 306. In practice, wire 306 causes a voltage drop that introduces an error that interferes with accurate cell voltage measurements. Therefore, to improve measurement accuracy, in embodiments, common switch 330 is opened, to cut the current flowing though wire 306 and resistor 312, 314, in effect, taking out the resistors of the measurement circuit in order to avoid an IR voltage drop that, otherwise, would corrupt the voltage measurement (e.g., a differential voltage between cells) of cell. In embodiments, once switch 330 is opened, the present voltage is held at local capacitor 324 then, e.g., after a programmable settling time (that may be adjusted according to the highest resistance or the lowest balancing current to allow the input to settle more quickly) passes, the voltage at, e.g., pin 326 may be measured without any unwanted voltage drop or power consumption, thus, avoiding a cell voltage measurement error. Since the voltage is an analog voltage, it may be digitized and processed as needed. Once the measurement is completed, switch 330 may be closed to turn back on the power through the second path 320.

In embodiments, after measuring, e.g., from the bottom cell (not shown) up to cell 302, but before measuring the voltage of the top cell (also not shown), common switch 330 may be opened (to reduce IR drop) and the top cell measured, then the measurement may resume with measuring from the top cell down to the bottom cell.

Figure 4:
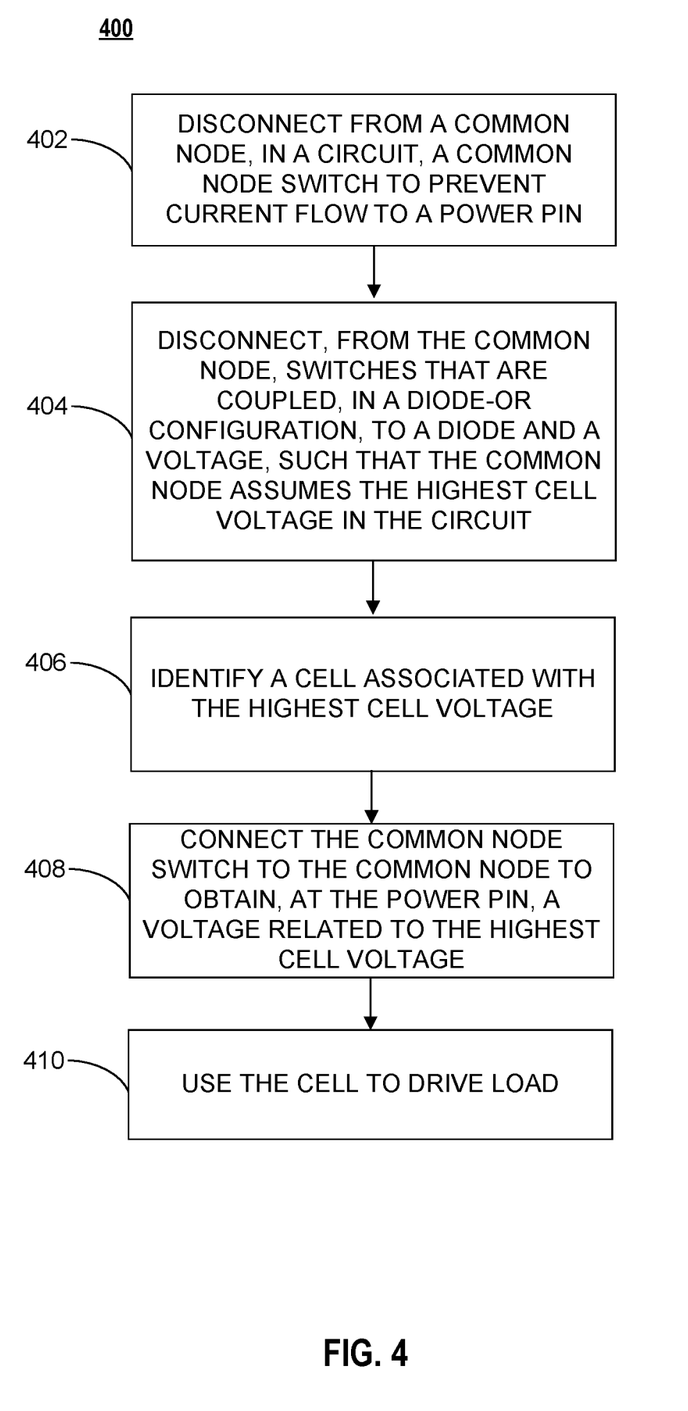
FIG. 4 is a flowchart of an illustrative process for identifying the highest cell voltage in a battery pack in accordance with various embodiments of the present disclosure.

FIG. 4 is a flowchart of an illustrative process for identifying the highest cell voltage in a battery pack in accordance with various embodiments of the present disclosure. Process 400 for identifying the highest cell voltage starts, at step 402, when a common node switch is disconnected from a common node such as to prevent current flow to a power pin in a circuit.

At step 404, switches that are coupled to a diode and a voltage in a diode-OR configuration are disconnected from the common node, such that the common node assumes the highest cell voltage in the circuit. In embodiments, this highest cell voltage may be determined, e.g., from a voltage measurement at the common node.

At step 406, a cell that is associated with the highest cell voltage in the circuit is identified.

At step 408, the common node switch is connected to the common node to obtain, e.g., at the power pin, the highest cell voltage or a voltage that is related to the highest cell voltage, e.g., a cell bus bar voltage that comprises the highest cell voltage.

At step 410, the cell associated with the highest cell voltage may be used to drive load.

Figure 5:
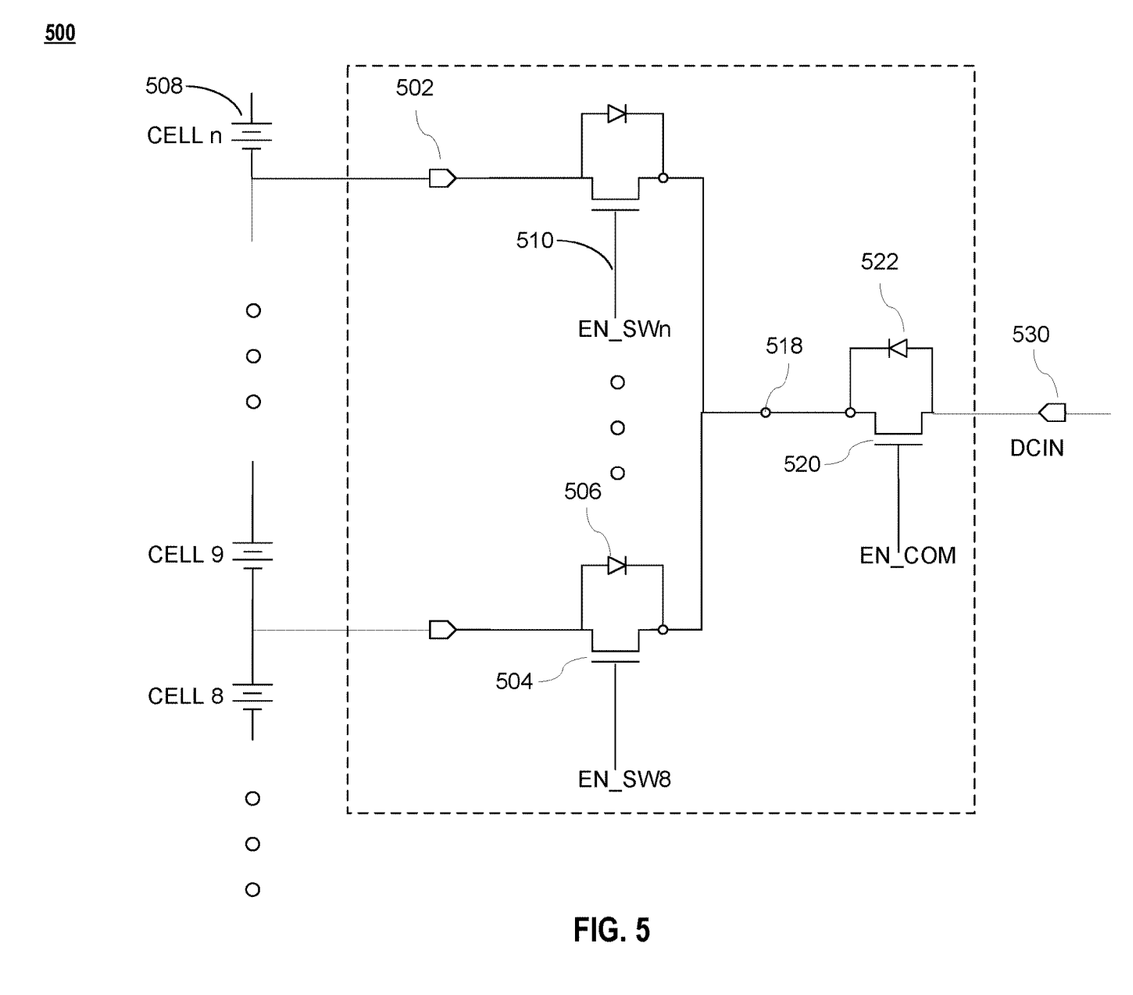
FIG. 5 is a schematic of an illustrative circuit implementation of the software-configurable system in FIG. 1 that utilizes the software-configurable circuit in FIG. 2.
Figure 6:
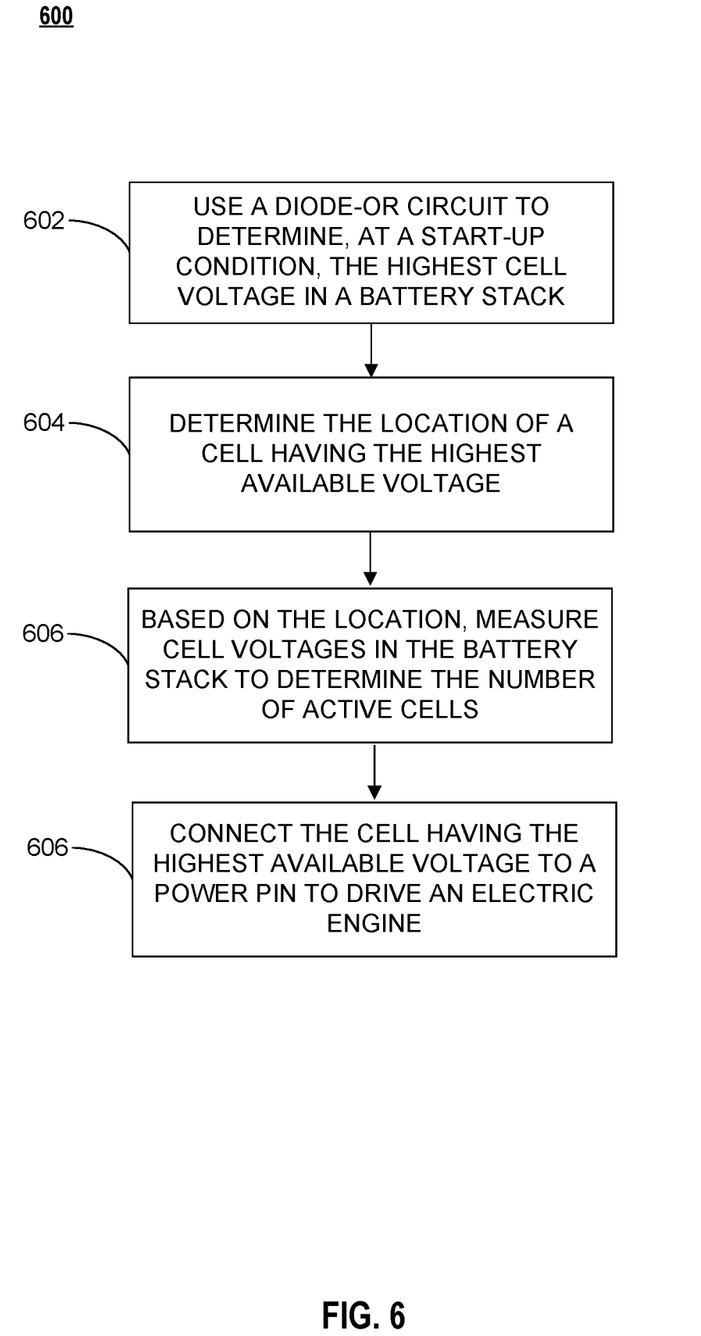
FIG. 6 is a flowchart of an illustrative process for using the software-configurable system, according to various embodiments of the present disclosure.

FIG. 5 is a schematic of an illustrative circuit implementation of the software-configurable system in FIG. 1 that utilizes the software-configurable circuit in FIG. 2. FIG. 6 is a flowchart of an illustrative process for using the software-configurable system, according to various embodiments of the present disclosure. Process 600 starts at step 602, when a diode-OR circuit is use to determine, e.g., at a start-up condition, the highest cell voltage in a battery stack.

At step 604, the location of a cell that has the highest available voltage is determined. It is understood that the highest available voltage may be different from the highest cell voltage as, for example, the voltage on top of a bus bar cannot by fully utilized as the voltage drop across the bus bar itself may be negative depending on the direction of the current flowing though the bus bar.

At step 606, based on the location of the cell that having the highest available voltage, cell voltages in the battery stack may be measured to determine the number of active cells. In embodiments, this may be accomplished by using a multiplexer that is coupled to the set of switches to sequentially measure all cells in the battery stack.

At step 608, the cell with the highest available voltage may be coupled to a power pin to drive, e.g., an electric engine.

It is understood that additional monitoring and battery management steps may be performed, e.g., safety related steps to verify that the detected voltage approximately equals to the sum of all cell voltages.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A method for automatically identifying the highest cell voltage in a battery stack, the method comprising:
   disconnecting from a common node, in a circuit, an input pin to prevent current flow between the common node and a set of power pins;
   disconnecting, from the common node, a set of switches that are coupled, in a diode- or configuration, each switch being coupled to at least a diode and a power pin, such that the common node assumes the highest cell voltage in the circuit;
   identifying a cell associated with the highest cell voltage;
   connecting a common node switch to the common node to obtain, at one of the power pins in the set of power pins, a voltage related to the highest cell voltage; and
   using the identified highest cell voltage to draw power from the cell or to perform a diagnostic procedure.

2. The method according to claim 1, wherein the diode- or configuration serves as an analog multiplexer that couples the input pin to the highest cell voltage in the battery stack to indicate a voltage sensing location.

3. The method according to claim 1, further comprising measuring the highest cell voltage at the common node.

4. The method according to claim 3, further comprising determining a number of active cells in the battery stack.

5. The method according to claim 1, wherein the highest cell voltage comprises a bus bar voltage.

6. The method according to claim 1, further comprising using a multiplexer coupled to the set of switches to sequentially measure cell voltages in the battery stack.

7. The method according to claim 6, wherein measuring cell voltages comprises sequentially measuring a voltage difference between adjacent cells.

8. The method according to claim 1, wherein the highest cell voltage is determined at a start-up condition.

9. A software-configurable battery monitoring circuit for automatically identifying the highest cell voltage in a battery stack, the battery monitoring circuit comprising:
   an input pin;
   a common node switch coupled to the input pin and to a common node, the common node switch when disconnected from the common node prevents current flow through the common node to determine the highest cell voltage in the battery monitoring circuit; and
   a set of switches coupled to the common node, each switch further coupled to a power pin to receive a cell voltage and to a diode, the set of switches being arranged in a diode- or configuration, such that when each switch is opened, the common node is coupled to the highest cell voltage in the battery management circuit.

10. The battery monitoring circuit according to claim 9, wherein the power pin is coupled to the cell voltage via a voltage node in a low impedance electrical path, the battery monitoring circuit further comprising a high impedance electrical path coupled to the voltage node.

11. The battery monitoring circuit according to claim 9, wherein the diodes are internal body-diodes that are directed opposite to an internal body-diode of the common node switch, such when the common node switch is open, at least one diode is reverse biased.

12. The battery monitoring circuit according to claim 9, further comprising a circuit that determines a number of active cells in the battery stack.

13. The battery monitoring circuit according to claim 9, wherein the highest cell voltage is determined at a start-up condition.

14. The battery monitoring circuit according to claim 9, wherein the diode- or configuration serves as an analog multiplexer that couples the input pin to the highest cell voltage in the battery stack to indicate a voltage sensing location.

15. The battery monitoring circuit according to claim 9, wherein the highest cell voltage comprises a bus bar voltage.

16. The battery monitoring circuit according to claim 9, further comprising a multiplexer coupled to the set of switches, the multiplexer sequentially measures cell voltages in the battery stack.

17. A method for using a software-configurable battery monitoring system, the method comprising:

using a diode- or circuit to determine, at a start-up condition, the highest cell voltage in a battery stack;

determining a location of a cell having the highest available voltage;

based on the location, measuring cell voltages in the battery stack to determine a number of active cells; and     using the highest cell voltage to draw power from the cell to drive a load or to perform a diagnostic procedure.

18. The method according to claim 17, wherein the diode- or circuit couples to the highest cell voltage in the battery stack.

19. The method according to claim 18, wherein further comprising sequentially measuring cell voltages in the battery stack by measuring voltage differences between adjacent cells.

20. The method according to claim 17, further comprising determining a number of active cells in the battery stack.

\* \* \* \* \*